United States Patent
Ler et al.

(10) Patent No.: US 9,583,554 B1
(45) Date of Patent: Feb. 28, 2017

(54) ADJUSTABLE GROUND SHIELDING CIRCUITRY

(71) Applicant: Altera Corporation, San Jose, CA (US)

(72) Inventors: Chun Lee Ler, Tangkak (MY); Hong Hai Teh, Sungai Bakap (MY); Albert Victor Kordesch, Georgetown (MY)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 14/581,428

(22) Filed: Dec. 23, 2014

(51) Int. Cl.
- *H01L 27/04* (2006.01)
- *H01L 49/02* (2006.01)
- *H01L 27/02* (2006.01)

(52) U.S. Cl.
CPC .......... *H01L 28/10* (2013.01); *H01L 27/0207* (2013.01)

(58) Field of Classification Search
USPC ........................................................ 257/531
See application file for complete search history.

(56) References Cited

U.S. PATENT DOCUMENTS

| | | | |
|---|---|---|---|
| 5,831,331 A | 11/1998 | Lee | |
| 6,452,249 B1 | 9/2002 | Maeda et al. | |
| 6,611,041 B2 | 8/2003 | Maeda et al. | |
| 6,744,129 B2 | 6/2004 | Chew et al. | |
| 6,756,656 B2 | 6/2004 | Lowther | |
| 6,905,889 B2 | 6/2005 | Lowther | |
| 7,259,625 B2 | 8/2007 | Sanderson | |
| 2004/0094822 A1* | 5/2004 | Yu | H01L 27/08 257/531 |
| 2004/0195651 A1* | 10/2004 | Zhang | H01F 17/0006 257/531 |
| 2005/0194350 A1* | 9/2005 | Hsieh | H01L 23/5223 216/13 |
| 2005/0247999 A1* | 11/2005 | Nishikawa | H01L 23/5225 257/531 |
| 2006/0049481 A1* | 3/2006 | Tiemeijer | H01F 17/0006 257/531 |
| 2008/0111176 A1* | 5/2008 | Barrows | H01L 29/94 257/312 |
| 2009/0189725 A1* | 7/2009 | Ding | H01F 21/005 336/137 |

(Continued)

OTHER PUBLICATIONS

Tang-Nian Luo et al., "A 44GHz 0.18um CMOS Superharmonic Frequency Divider," Microwave symposium, p. 1409-1412, Jun. 2007.

(Continued)

*Primary Examiner* — Andy Huynh
*Assistant Examiner* — Sitaramarao S Yechuri

(57) ABSTRACT

An integrated circuit (IC) die may include a substrate layer and an inductor with an associated capacitance formed on one of multiple metal layers above the substrate layer. Power shielding strips may be formed between the inductor and the substrate layer. Portions of the power shielding strips may be selectively activated to adjust the capacitance of the inductor. As an example, switches may be coupled to the power shielding strips to selectively couple a portion of the power shielding strips to a ground voltage to increase the capacitance of the inductor. As another example, a fuse element may be used to selectively activate desired portions of the power shielding strips.

11 Claims, 7 Drawing Sheets

(56) References Cited

U.S. PATENT DOCUMENTS

| | | | |
|---|---|---|---|
| 2010/0230784 A1* | 9/2010 | Teggatz | H01F 17/0033 |
| | | | 257/531 |
| 2012/0091558 A1* | 4/2012 | Loke | H01L 23/5225 |
| | | | 257/531 |
| 2013/0093045 A1* | 4/2013 | Cho | H01L 23/5223 |
| | | | 257/531 |
| 2013/0234286 A1* | 9/2013 | Nakashiba | H01L 23/522 |
| | | | 257/531 |
| 2014/0159854 A1* | 6/2014 | Samala | H01F 17/0006 |
| | | | 336/84 C |
| 2015/0115402 A1* | 4/2015 | Yen | H01L 23/5223 |
| | | | 257/531 |

OTHER PUBLICATIONS

Y.-T Chen et al, "Low-Voltage K-Band Divide-by-3 Injection-Locked Frequency Divider with Floating Source Differential Injector," IEEE Trans Microwave Theory and Tech., p. 60-67 Jan. 2012.

\* cited by examiner

ADJUSTABLE GROUND SHIELDING CIRCUITRY

BACKGROUND

Integrated circuits (ICs) may include transceiver circuitry that includes high-speed receivers and transmitters that may be used in various types of applications. Generally, an inductance-capacitance voltage-controlled oscillator (LC-VCO) circuit is used to control the tuning frequency of the transceiver circuitry on an IC. Accordingly, the tuning range of the transceiver circuitry is determined by the tuning range of the LC-VCO circuit that controls the transceiver circuitry.

As is generally known, an LC-VCO circuit may include an inductor (L) (or inductors) and variable capacitors or varactors (C). Even though an LC-VCO circuit with a wide frequency tuning range is generally desired, the tuning range of an LC-VCO circuit is typically limited by the minimum and maximum capacitance values of the varactors in the LC-VCO circuit. A capacitor array with metal-oxide-semiconductor field-effect transistor (MOSFET) switches is usually used to enlarge the tuning range of an LC-VCO circuit. However, the capacitor array with MOSFET switches typically occupies additional die area and hence increases the overall die area required for the LC-VCO circuit.

For high-speed circuitry, inductors with a high quality factor (Q) are preferred. Achieving high Q is generally challenging due to inductor loss that results from current flowing from the inductor to the substrate of the IC. To improve Q, a patterned ground shield is conventionally used to isolate the inductor from the substrate. However, the patterned ground shield may introduce a fixed parasitic capacitance to the LC-VCO circuit. Parasitic capacitance is undesirable because it reduces the tuning range and limits the resonance frequency of the LC-VCO circuit.

It is within this context that the embodiments described herein arise.

SUMMARY

An IC with an inductor and a patterned ground shield is provided. The patterned ground shield includes ground shielding strips that may be selectively activated or coupled to a ground voltage (or other power supply voltage) to increase the capacitance of the inductor and adjust the resonant frequency of an LC-VCO circuit in the IC. Embodiments of the present invention include different configurations for such types of patterned ground shields.

It is appreciated that the present invention can be implemented in numerous ways, such as a process, an apparatus, a system, or a device. Several inventive embodiments of the present invention are described below.

An IC die may include a substrate layer and an inductor with an associated capacitance value. The inductor may be formed in a metal layer above the substrate layer. Multiple ground shielding strips may be formed between the inductor and the substrate layer. The ground shielding strips may collectively form a patterned ground shield for the inductor. Selected ground shielding strips may accordingly be activated to increase the capacitance of the inductor. As an example, switching circuitry may be coupled to the ground shielding strips to selectively activate the ground shielding strips.

A patterned ground shielding strip may also be formed in the same metal layer as the inductor. As an example, the patterned ground shielding strip may be formed laterally adjacent to the inductor. The patterned ground shielding strip may be used to increase the capacitance of the inductor. In some scenarios, additional ground shielding strips formed in other metal layers (e.g., metal layers between the inductor and the substrate layer) in the IC die and the patterned ground shielding strip formed adjacent to the inductor may collectively form a patterned ground shield for the inductor.

Alternatively, an IC may include an inductor with first and second edges where current flows in one direction along the first edge of the inductor and flows in another direction along the second edge of the inductor. First and second groups of power shielding strips may be formed directly under the respective first and second edges of the inductor. A switching circuit may be coupled between the first and second groups of power shielding strips to electrically connect the first and second groups of power shielding strips. The capacitance of the inductor may be increased when the first and second groups of power shielding strips are electrically connected.

Further features of the invention, its nature and various advantages will be more apparent from the accompanying drawings and the following detailed description of the preferred embodiments.

DETAILED DESCRIPTION

The embodiments provided herein include integrated circuits (ICs) with an inductor and a patterned ground shield. The patterned ground shield includes ground shielding strips that may be selectively activated or coupled to a ground voltage to adjust the capacitance of the inductor. Embodiments of the present invention include different configurations for such a patterned ground shield.

It will be obvious, however, to one skilled in the art, that the present exemplary embodiments may be practiced without some or all of these specific details. In other instances, well-known operations have not been described in detail in order not to unnecessarily obscure the present embodiments.

Figure 1:
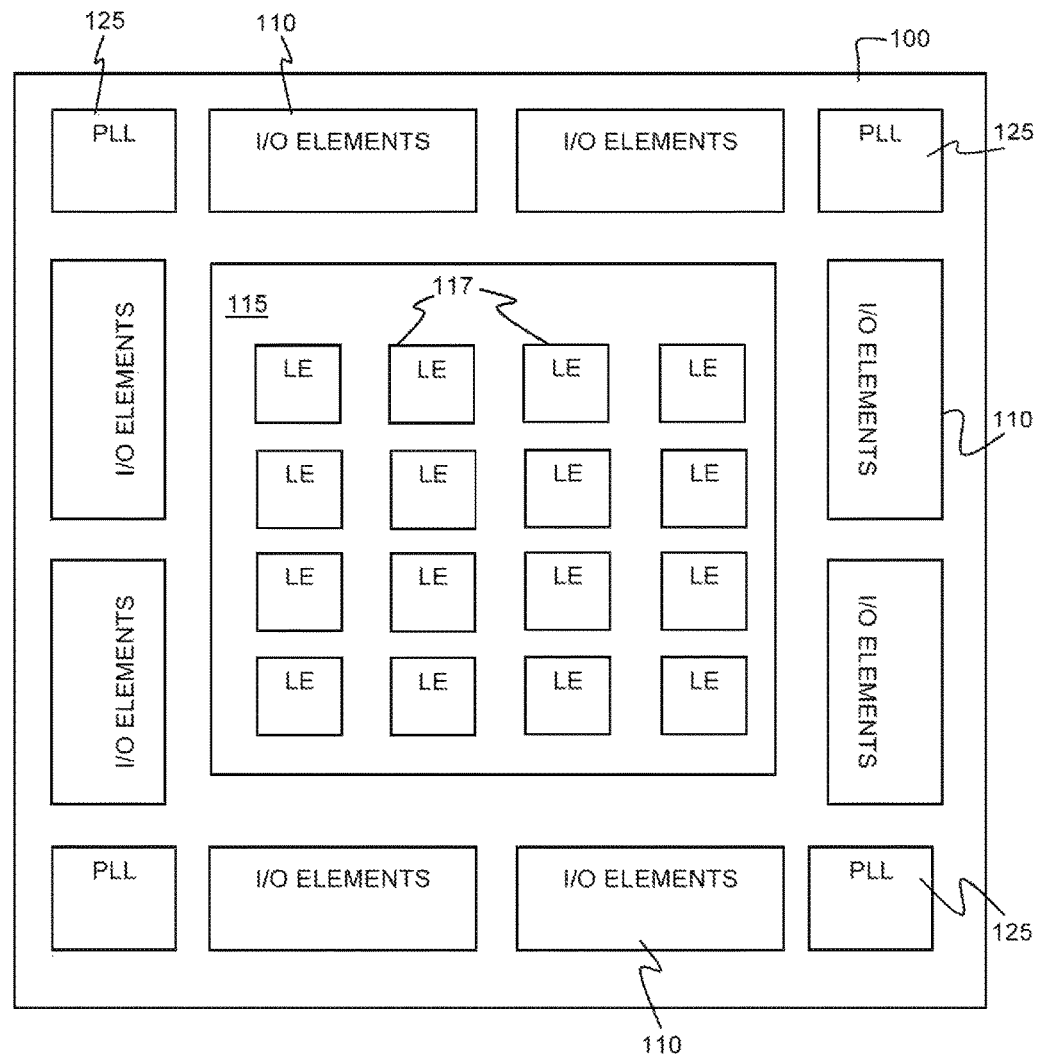
FIG. 1 is a block diagram of an illustrative integrated circuit in accordance with embodiments of the present invention.

An IC device, such as a field-programmable gate array (FPGA) device or an application specific integrated circuit (ASIC) device, generally includes a core region and a peripheral region with input-output circuitry. FIG. 1, meant to be illustrative and not limiting, shows a block diagram of IC 100 that can implement embodiments of the present invention. An IC device such as IC 100 may include core logic region 115 at its center region and input-output elements 110 arranged at its peripheral region.

Core logic region 115 may be populated with logic cells that include "logic elements" (LEs) 117, among other circuits. LEs 117 may include look-up table-based logic regions and may be grouped into "Logic Array Blocks" (LABs). LEs 117 and groups of LEs or LABs can be configured to perform logical functions desired by the user. Configuration data loaded into configuration memory may be used to produce control signals that configure LEs 117 and groups of LEs and LABs to perform the desired logical functions.

As is generally known, IC devices may use a clock signal to synchronize different circuit elements in the device. Phase-locked loops (PLLs) 125 for clock generation and timing, may be located outside core logic region 115 (e.g., at corners of IC 100 and adjacent to input-output elements 110 as shown in FIG. 1). It should be noted that IC 100 may include a clock network (not shown) that is used to transmit clock signals from clock circuits (e.g., PLLs 125) to core logic region 115 and various parts of IC 100, including input-output elements 110.

Signals received at input-output elements 110 from external circuitry or components coupled to IC 100 may be routed from input-output elements 110 to core logic region 115 or other logic blocks (not shown) on IC 100. Core logic region 115, or more specifically, logic blocks within core logic region 115, on IC 100 may perform functions based on the signals received. Signals are accordingly sent from core logic region 115 to any external circuitry or components that may be connected to IC 100 via input-output elements 110.

In the embodiment of FIG. 1, input-output elements 110 may include input-output buffers and various circuits that connect IC 100 to other external components via a variety of input-output interfaces. A single device such as IC 100 may support a variety of different interfaces and each individual input-output block 110 may support a different input-output standard with a different interface or protocol (e.g., high-speed serial interface protocol).

As an example, input-output blocks 110 may include transceiver circuitry. It should be noted that high-speed receivers and transmitters are used in applications that require a wide frequency tuning range. Such transceiver circuitry, therefore, may include an inductance-capacitance voltage-controlled oscillator (LC-VCO) circuit that is used to control the tuning frequency of the transceiver circuitry. To improve the quality factor (Q) of the inductor in the LC-VCO circuit, a patterned ground shield structure may be formed in IC 100.

Figure 2:
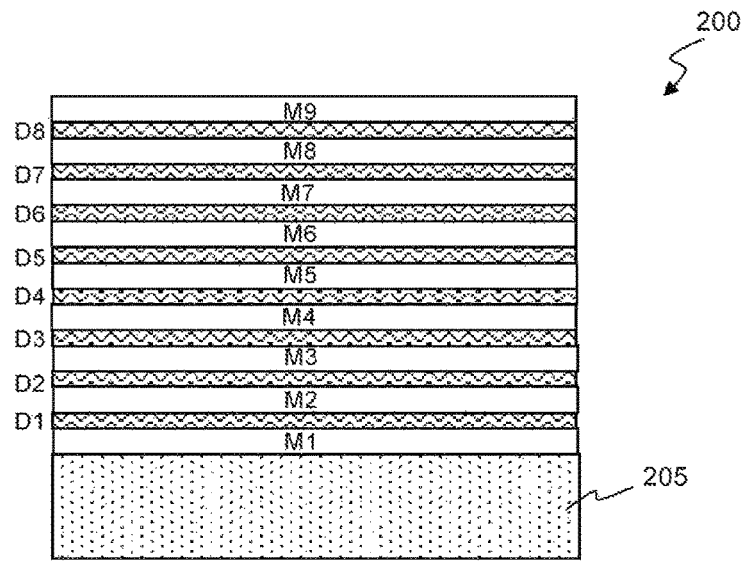
FIG. 2 shows a cross-sectional side view of an illustrative integrated circuit die in accordance with embodiments of the present invention.

FIG. 2 shows an illustrative cross-sectional side view 200 of an IC die in accordance with embodiments of the present invention. As shown in FIG. 2, the IC die may include multiple metal layers M1-M9 (sometimes referred to as metal routing layers) formed over substrate layer 205 (e.g., a semiconductor substrate such as a p-type silicon substrate). In FIG. 2, every two metal layers M1-M9 are separated by a dielectric layer D1-D8. It should be noted that adjacent metal layers may be connected to each other through vias formed in the dielectric layers D1-D8 (not shown). Dielectric layers D1-D8 are therefore sometimes referred to as via layers. The alternating arrangement of metal routing layers and via layers is sometimes referred to collectively as a dielectric stack or as interconnect routing layers. It should also be noted that even though metal layers M1-M9 are shown, an IC die may include more (or fewer) metal layers with dielectric via layers formed in between two metal layers.

An inductor such as that mentioned above may be formed in any of the metal layers M1-M9. It should be noted that interconnects (not shown in FIG. 2) may be formed in any or all of the metal layers M1-M9 to couple the inductor to other circuitry on the IC die. As an example, the inductor (or the coil of the inductor) may be formed in an upper metal layer or a metal layer farthest from the substrate layer (e.g., metal layer M9 in FIG. 2).

A patterned ground shield with multiple ground shielding strips may be formed in any of the metal layers. In one embodiment, a portion of the ground shielding strips may be formed in the same metal layer as the inductor (e.g., metal layer M9, if the inductor is formed in that layer). In some embodiments, switching circuitry (not shown in FIG. 2) may be coupled to the ground shielding strips. The switching circuitry may thus activate selected portions of the ground shielding strips to adjust the capacitance of the inductor formed in one of the metal layers.

In some embodiments, the ground shielding strips of the patterned ground shield may be formed in different metal layers (e.g., any of metal layers M1-M8). The ground shielding strips may be selectively activated or coupled to a ground voltage as required to adjust the capacitance of the inductor. As an example, portions of the ground shielding strips in the patterned ground shield may be activated to adjust the capacitance of the inductor formed above (or, in some instances, below) the patterned ground shield structure. As an example, activating portions of the ground shielding strips in the patterned ground shield may increase the capacitance of the inductor. In some instances, the tuning range of an LC-VCO circuit in the IC may be adjusted by selectively activating portions of the ground shielding strip.

Figure 3A:
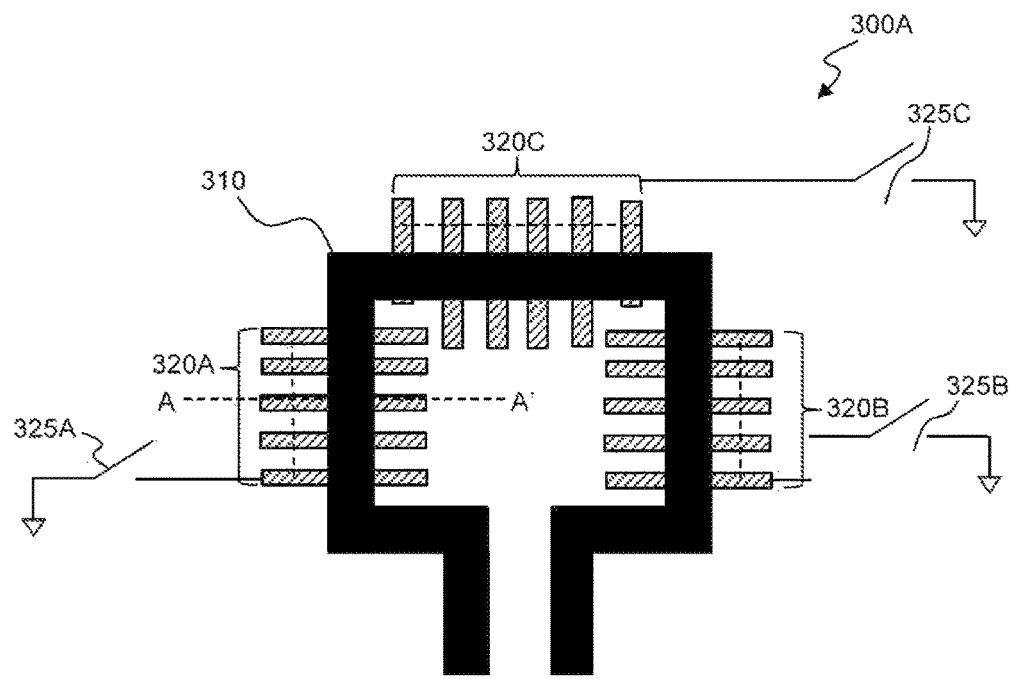
FIG. 3A is a topographical view of an illustrative inductor structure formed in an integrated circuit in accordance with embodiments of the present invention.

FIG. 3A is an illustrative topographical view 300A of inductor structure 310 formed in an IC in accordance with embodiments of the present invention. As shown in FIG. 3A, groups of ground shielding strips 320A, 320B, and 320C may be formed beneath inductor structure 310. Inductor structure 310 may have an associated capacitance and in one embodiment, its capacitance may be adjusted by selectively activating portions or groups of ground shielding strips 320A, 320B, and 320C.

As shown in the embodiment of FIG. 3A, switching circuitry may be used to selectively activate portions of the ground shielding strips. As an example, switching circuitry 325A is coupled to a group of ground shielding strips 320A, switching circuitry 325B is coupled to ground shielding strips 320B, and switching circuitry 325C is coupled to ground shielding strips 320C. The groups of ground shielding strips shown in FIG. 3A may collectively form a patterned ground shield for inductor structure 310.

The ground shielding strips are formed such that the individual ground shielding strips in each of groups 320A, 320B, and 320C runs orthogonally with respect to a corresponding side of inductor structure 310. In one embodiment, the groups of ground shielding strips 320A, 320B, and 320C may include ground shielding strips formed in different metal layers beneath inductor structure 310. As an example, inductor structure 310 may be formed in a metal layer farthest from the substrate layer, whereas the groups of ground shielding strips 320A, 320B, and 320C may include ground shielding strips that are formed in any of the metal layers between inductor structure 310 and the substrate layer.

Accordingly, each switching circuitry (325A, 325B, and 325C) may include individual switches formed in different metal layers to control or activate the ground shielding strips formed in those metal layers (details of which are shown in the cross-section view along the line A-A', as described below with reference to FIG. 3B). To activate a selected portion of ground shielding strips in each group of ground shielding strips 320A, 320B and 320C, the corresponding switches in the switching circuitry 325A, 325B, and 325C may be closed.

When switches within switching circuitries 325A, 325B, and 325C are closed, the respective groups of ground shielding strips 320A, 320B, and 320C may be coupled to a ground voltage and may accordingly be activated. In one embodiment, fuses may be used as switches in switching circuitries 325A, 325B, and 325C. In another embodiment, the switches may include transistors.

Figure 3B:
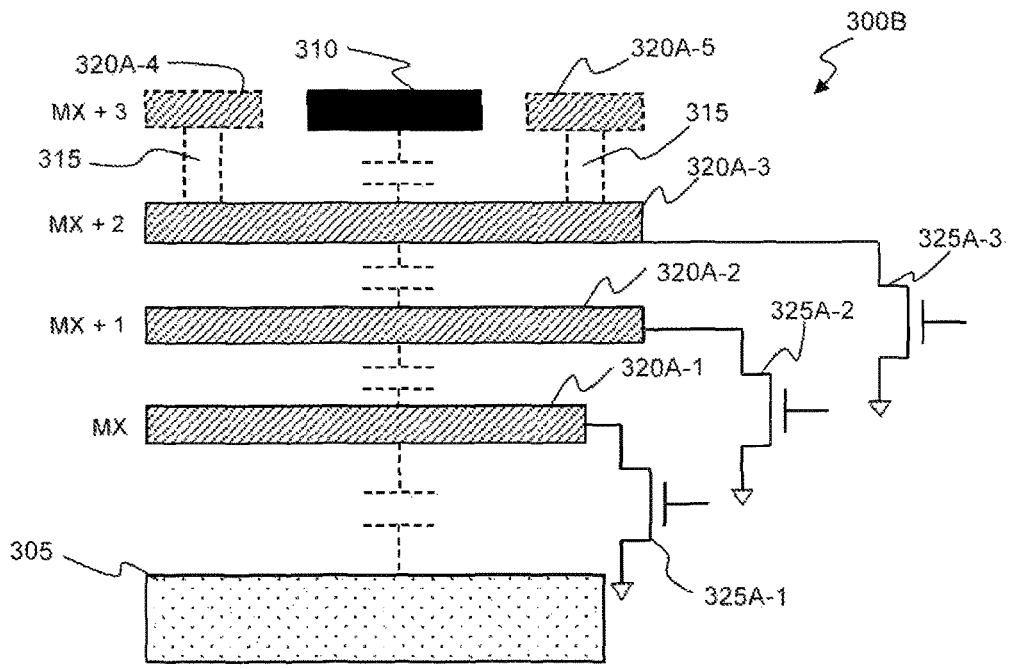
FIG. 3B shows an illustrative cross-sectional side view along line A-A' of the structure shown in FIG. 3A in accordance with embodiments of the present invention.

FIG. 3B shows an illustrative cross-sectional side view 300B along line A-A' of the structure shown in FIG. 3A in accordance with embodiments of the present invention. Four metal layers, MX, MX+1, MX+2, and MX+3 are shown on top of substrate 305 in the embodiment of FIG. 3B. Ground shielding strips 320A-1, 320A-2, and 320A-3 are formed in metal layers MX, MX+1, and MX+2, respectively, and inductor 310 (or part of inductor 310) is formed in metal layer MX+3.

A respective switch circuit may be coupled to each ground shielding strip to selectively activate the respective ground shielding strips. As shown in FIG. 3B, switch circuit 325A-1 is coupled to ground shielding strip 320A-1; switch circuit 325A-2 is coupled to ground shielding strip 320A-2; and switch circuit 325A-3 is coupled to ground shielding strip 320A-3. In one scenario, as shown in FIG. 3B, transistors may be used as switches. It should be noted that even though N-type metal-oxide-semiconductor field-effect (NMOS) transistors are shown in FIG. 3, other transistors such as P-type metal-oxide-semiconductor field-effect (PMOS) transistors may be used in this context.

A source-drain terminal of each of the NMOS transistors 325A-1, 325A-2, and 325A-3 is coupled to a ground voltage whereas another source-drain terminal is coupled to a corresponding ground shielding strip. Different logic values may be supplied to the gate terminals of the respective NMOS transistors 325A-1, 325A-2, and 325A-3. For example, when a logic high value is supplied to the gate terminal of any of the transistors 325A-1, 325A-2, and 325A-3, that particular transistor will activate its corresponding ground shielding strip by connecting that ground shielding strip to a ground voltage. It should be noted that even though a ground voltage is described herein, the transistors or switches may be coupled to a positive power supply voltage terminal, an intermediate voltage terminal, a negative power supply voltage terminal, etc.

Two ground shielding strips (e.g., metal strips) on two adjacent metal layers (or conductive layers) may form a capacitor (shown in dotted lines), or have a capacitance value. In the embodiment of FIG. 3B, ground shielding strip 320A-1 in metal layer MX and substrate layer 305 beneath metal layer MX may form a capacitor. Accordingly, inductor 310 formed in metal layer MX+3 and ground shielding strip 320A-3 in metal layer MX+2 may collectively form another capacitor.

In some instances, additional ground shielding strips, if desired, may be formed in the same metal layer as the inductor. As an example, additional ground shielding strips 320A-4 and 320-5 may be formed adjacent to inductor 310. In FIG. 3B, the additional ground shielding strips 320A-4 and 320A-5 are shown in dotted lines as both ground shielding strips 320A-4 and 320A-5 are not shown in the topographical view in FIG. 3A.

Accordingly, the additional ground shielding strips 320A-4 and 320A-5 may be coupled to ground shielding strip 320A-3 in metal layer MX+2. As shown in FIG. 3B, vias 315 may be used to connect additional ground shielding strips 320A-4 and 320A-5 to ground shielding strip 320A-3. It should be noted that vias 315 are represented with dotted lines to highlight that the additional ground shielding strips 320A-4 and 320A-5 may be optional in this context. In some instances, having additional ground shielding strips 320A-4 and 320A-5 may further increase the capacitance value of inductor structure 310.

Figure 3C:
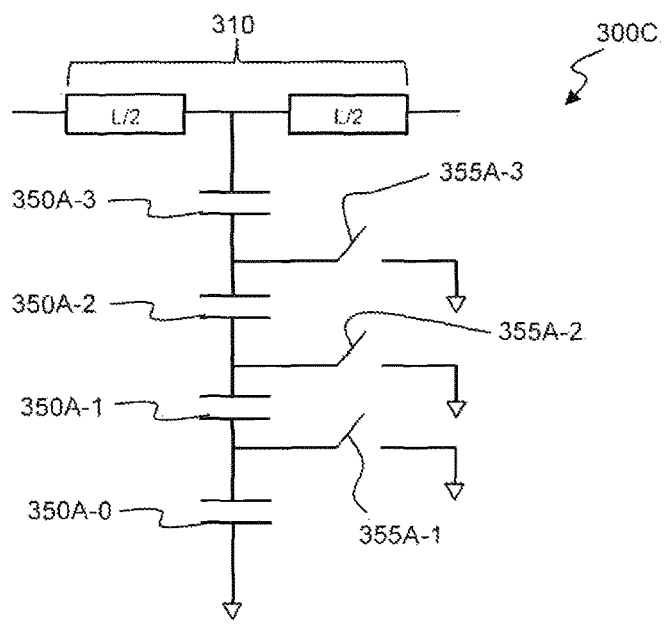
FIG. 3C is a circuit representation of the cross-sectional side view structure of FIG. 3B in accordance with embodiments of the present invention.

FIG. 3C is an illustrative circuit representation of the cross-sectional side view structure 300B of FIG. 3B in accordance with embodiments of the present invention. Circuit 300C shows inductor 310 represented as two separate inductive components, each with an inductance, L/2. Four capacitors 350A-0, 350A-1, 350A-2, and 350A-3 are coupled to inductor 310. It should be noted that the respective capacitors 350A-0, 350A-1, 350A-2, and 350A-3 are formed by ground shielding strip 320A-1 with substrate layer 305; adjacent ground shielding strips 320A-1 and 320A-2, and 320A-2 and 320A-3; and inductor 310 and ground shielding strip 320A-3 (as shown in FIG. 3B).

Each of the capacitors 350A-1-350A-3 may be controlled by respective switching circuits 355A-1-350A-3. It should be noted that switching circuits 355A-1, 355A-2, and 355A-3 may represent NMOS transistors 325A-1, 325A-2, and 325A-3, respectively. As shown in FIG. 3C, one side of capacitor 350A-0 is coupled capacitor 350A-1 whereas another side of capacitor is coupled to a ground voltage. Accordingly, when none of the switching circuits 355A-1-355A-3 is closed, capacitors 350A-1-350A-3 are connected in series to capacitor 350A-0, which is coupled to a ground voltage. If should be appreciated that connecting capacitors in series may lower the total capacitance of a circuit as the total capacitance in series may be obtained from the following equation: total capacitance, $$C = \frac{1}{\frac{1}{C1} + \frac{1}{C2} + \ldots \frac{1}{Cn}}.$$

As can be seen in the equation above, connecting more capacitors in series will lower the total capacitance in a circuit. It should be noted that the total capacitance of multiple capacitors that are coupled in parallel is represented by the following equation: total capacitance, $C = C1 + C2 + \ldots Cn$. Accordingly, connecting capacitors in parallel increases the total capacitance of a circuit. Therefore, when any of the switching circuits 355A-1-355A-3 is closed, thereby creating a parallel connection, the total capacitance of circuit 300C may be increased. For example, when all of the switching circuits 355A-1, 355A-2, and 355A-3 are closed, capacitors 350A-0, 355A-1, 355A-2, and 355A-3 may be connected in parallel. In one embodiment, any or all of switching circuits 355A-1, 355-2, and 355A-3 may be closed at any one time.

It should be noted that even though four metal layers MX, MX+1, MX+2, and MX+3 are shown in the embodiment of FIG. 3B, more or fewer metal layers may be formed in an integrated circuit, and more (or fewer) ground shielding strips may be formed on those metal layers. Accordingly, more or fewer capacitors may be connected in circuit 300C of FIG. 3C. As an example, an additional metal layer may be formed above metal layer MX+3 of FIG. 3B and an additional ground shielding strip may be formed in that metal layer.

Figure 4:
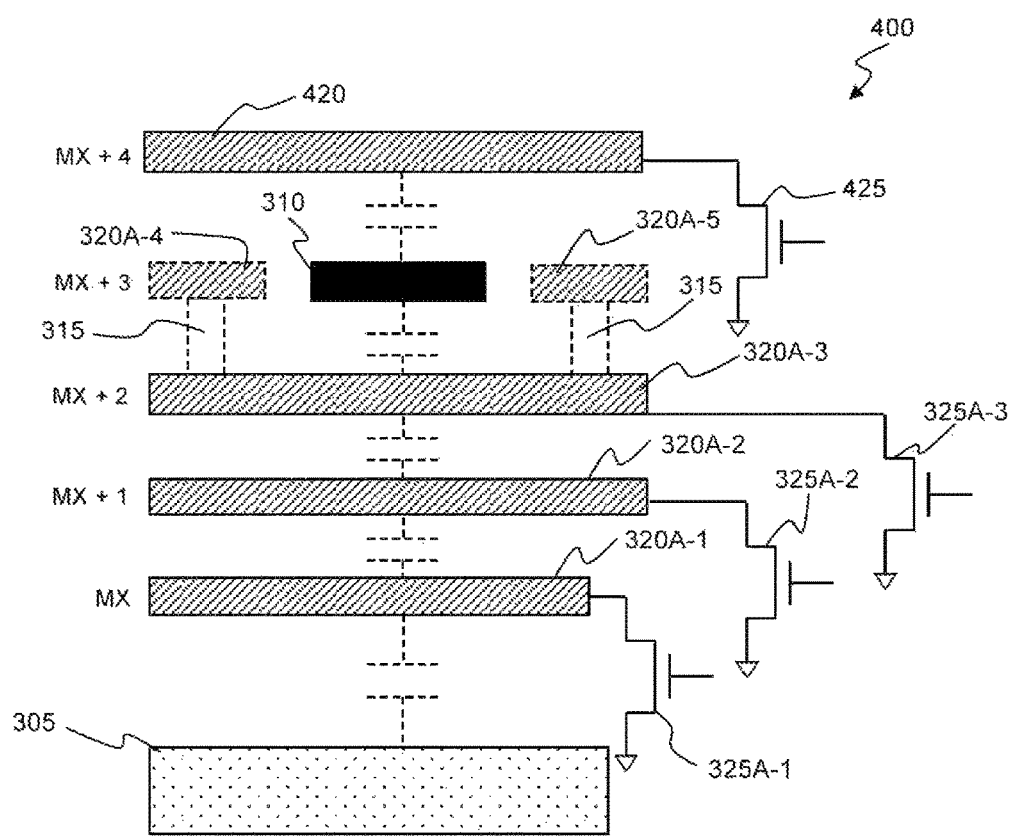
FIG. 4 shows a cross-sectional side view of an illustrative inductor structure formed between two metal layers in accordance with embodiments of the present invention.

FIG. 4 shows an illustrative cross-sectional side view 400 of an inductor structure formed between two metal layers in accordance with embodiments of the present invention. It should be noted that cross-sectional side view 400 shares similarities with cross-sectional side view 300B of FIG. 3B and as such, for the sake of brevity, elements that have been described above (e.g., inductor structure 310; substrate layer 305; metal layers MX, MX+1, MX+2, MX+3, and MX+4; ground shielding strips 320A-1, 320A-2, 320A-3, 320A-4, and 320A-5; switching circuits 325A-1, 325A-2, and 325A-3; and vias 315) are not described in detail again.

In the embodiment of FIG. 4, an additional ground shielding strip 420 is formed in a metal layer MX+4 above inductor structure 310. Accordingly, ground shielding strip 420 and inductor structure 310 may form a capacitor structure (shown in dotted lines). A switching circuit 425 may be coupled to ground shielding strip 420. As with switching circuits 320A-1-320A-3, switching circuit 425 may selectively activate ground shielding strip 420 to adjust the capacitance value provided to inductor structure 310. In the embodiment of FIG. 4, an NMOS transistor is used as switching circuit 425.

It should be noted that vias 315 (in dotted lines) may be formed between ground shielding strip 420 and ground shielding strips 320A-4 and 320A-5 instead of between ground shielding strip 320A-3 and ground shielding strips 320A-4 and 320A-5. In some instances, fewer or more switching circuits may be used to control the respective ground shielding strips 320A-1, 320A-2, 320A-3, 320A-4, 320A-5, and 420. Accordingly, different configurations (e.g., with different numbers of ground shielding strips or switching circuits) may be utilized in this context.

Figure 5A:
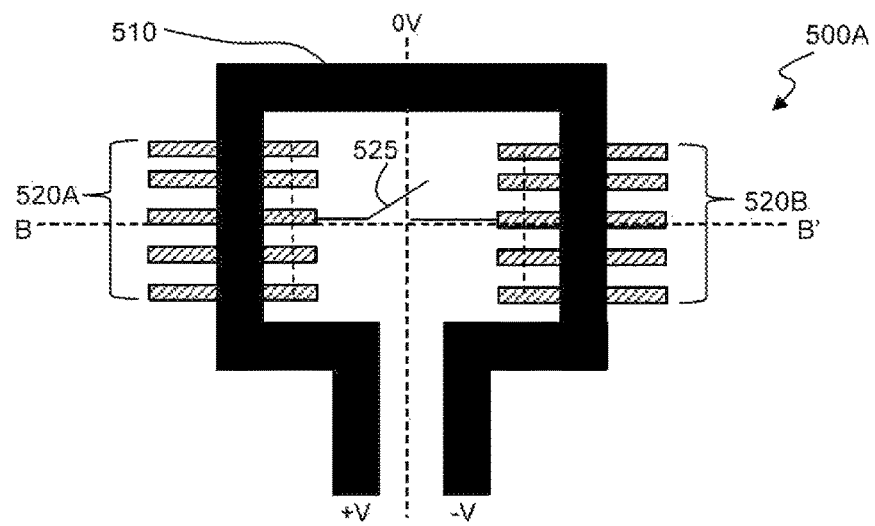
FIG. 5A shows a topographical view of an illustrative inductor structure and ground shielding strips formed below the inductor structure in accordance with embodiments of the present invention.

FIG. 5A shows a topographical view 500A of an inductor structure and ground shielding strips formed below the inductor structure in accordance with embodiments of the present invention. Groups of ground shielding strips 520A and 520B are formed beneath inductor structure 510. Ground shielding strips 520A and 520B may not be coupled to a ground voltage. As such, the two groups of ground shielding strips 520A and 520B may form a floating shield beneath inductor structure 510. Inductor structure 510 may have an associated capacitance that may be adjusted by selectively activating portions or groups of ground shielding strips 520A and 520B.

In the embodiment of FIG. 5A, switching circuit 525 is coupled between the two groups of ground shielding strips 520A and 520B. Inductor structure 510 may be coupled to signals (e.g., currents or voltages) that are 180 degrees out of phase with each other (e.g., differential signals/currents, or currents flowing in opposite directions). For example, one end of inductor structure may be driven by a voltage level (+V) whereas another end of the inductor structure may be driven by a 180-degree phase-shifted version of that voltage level (−V). Such an arrangement may create a virtual ground (e.g., 0V) between ground shielding strips 520A and 520B beneath inductor structure 510.

The ground shielding strips are formed such that one group of ground shielding strips 520A extends perpendicularly along a first edge of inductor structure 510 and another group of ground shielding strips 520B extends perpendicularly a second edge (that is parallel to the first edge) of inductor structure 510. It should be noted that the groups of ground shielding strips 520A and 520B may include ground shielding strips formed in different metal layers (not shown in FIG. 5A) beneath inductor structure 510.

Switching circuitry 525 may be coupled between the two groups of ground shielding strips 520A and 520B to connect selected ground shielding strips to the virtual ground formed between ground shielding strips 520A and 520B. As there may be ground shielding strips formed in different metal layers beneath (or even above) inductor structure 510, switching circuitry 525 may accordingly include individual switches formed in the different metal layers to control or activate the ground shielding strips formed in those metal layers.

Details of ground shielding strips and switches formed in different metal layers are shown in the cross-section view along the line B-B', as described below with reference to FIG. 3B. To activate a selected portion of ground shielding strips in each group of ground shielding strips 520A and 520B, the corresponding switches in switching circuitry 525 may be closed.

Figure 5B:
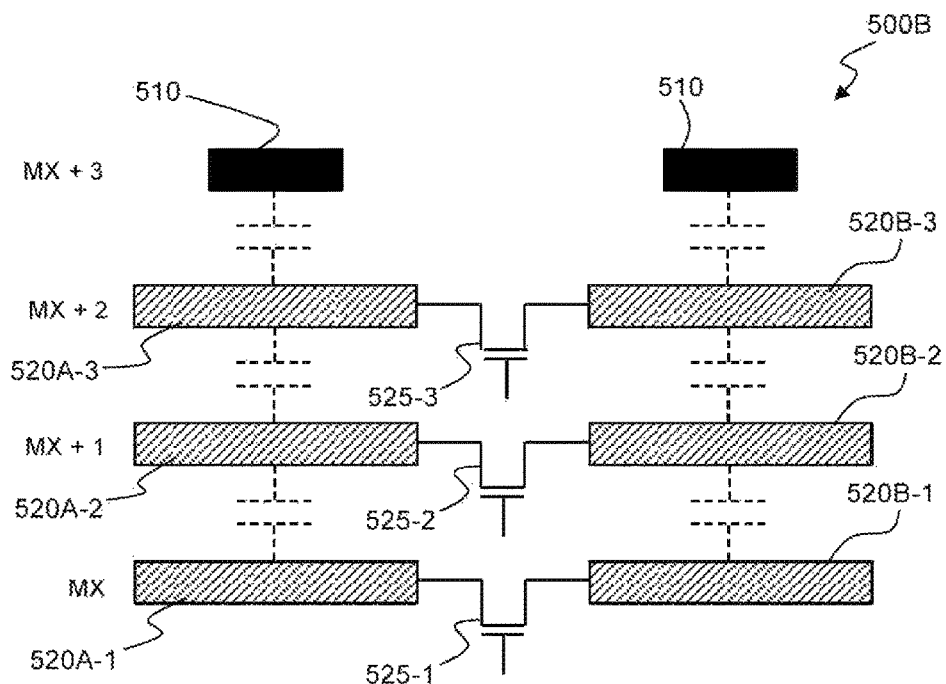
FIG. 5B shows an illustrative cross-sectional side view along line B-B' of the structure shown in FIG. 5A in accordance with embodiments of the present invention.

FIG. 5B shows an illustrative cross-sectional side view 500B along line B-B' of the structure shown in FIG. 5A in accordance with embodiments of the present invention. In FIG. 5B, Ground shielding strips 520A-1/520B-1, 520A-2/520B-2, and 520A-3/520B-3 are formed in metal layers MX, MX+1, and MX+2, respectively, and inductor structure 510 (or part of inductor structure 510) is formed in metal layer MX+3.

A switch circuit may be coupled between two adjacent ground shielding strips in the same metal layer to selectively activate the respective ground shielding strips. As shown in FIG. 5B, switch circuit 525-1 is coupled between ground shielding strips 520A-1 and 520B-1 in metal layer MX, switch circuit 525-2 is coupled to between ground shielding strips 520A-2 and 520B-2, and switch circuit 525-3 is coupled between ground shielding strips 520A-3 and 520B-3. In one scenario, as shown in FIG. 5B, transistors may be used as switches. It should be noted that even though NMOS transistors are shown in FIG. 5B, other transistors such as PMOS transistors may be used in this context.

A source-drain terminal of each of the NMOS transistors 525-1, 525-2, and 525-3 is coupled to the respective ground shielding strips 520A-1, 520A-2, and 520A-3, whereas another source-drain terminal is coupled to the respective ground shielding strips 520B-1, 520B-2, and 520B-3. Different logic values may be supplied to the gate terminals of the respective NMOS transistors 525-1, 525-2, and 525-3. For example, when a logic high value is supplied to the gate terminal of any of the transistors 525-1, 525-2, and 525-3, that particular transistor will activate its corresponding ground shielding strips by connecting the two adjacent ground shielding strips together.

It should be noted that two ground shielding strips in two adjacent metal layers (or conductive layers) may form a capacitor (shown in dotted lines), or have a capacitance value. In the embodiment of FIG. 5B, ground shielding strip 520A-1 (or ground shielding strip 520B-1) in metal layer MX and ground shielding strip 520A-2 (or ground shielding strip 520B-2) in metal layer MX+1 may form a capacitor.

Accordingly, inductor structure 510 formed in metal layer MX+3 and ground shielding strip 520A-3 (or 520B-3) in metal layer MX+2 may collectively form another capacitor.

Figure 5C:
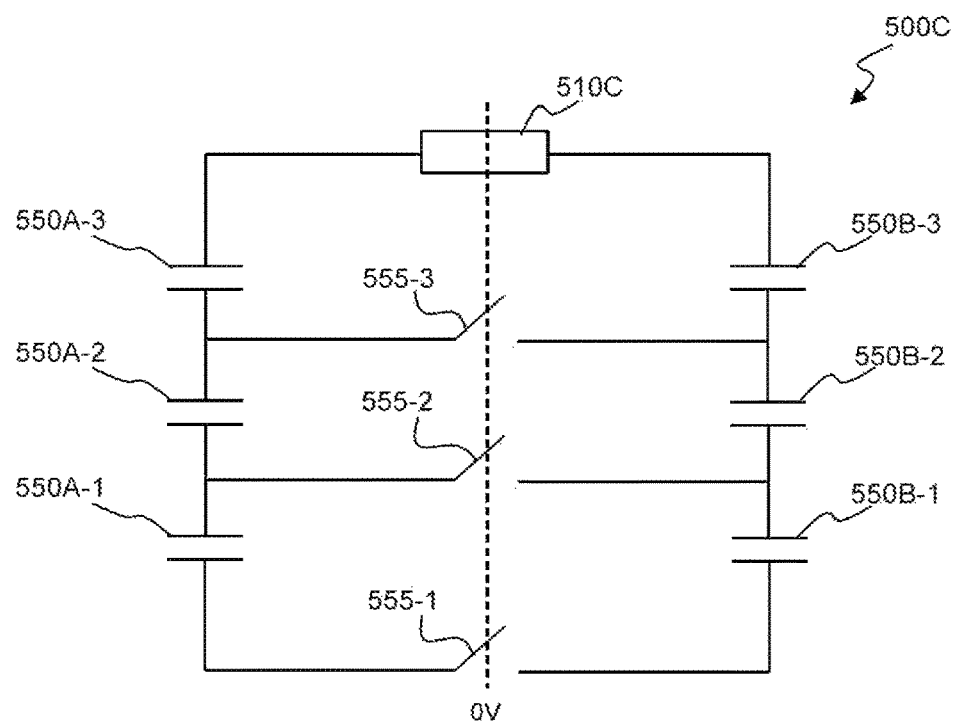
FIG. 5C is a circuit representation of the cross-sectional side view of FIG. 5B in accordance with embodiments of the present invention.

FIG. 5C is an illustrative circuit representation of the cross-sectional side view 500B shown in FIG. 5B in accordance with embodiments of the present invention. Circuit 500C shows six capacitors 550A-1, 550A-2, 550A-3, 550B-1, 550B-2, and 550B-3 coupled to inductor 510. It should be noted that the six capacitors represent the capacitors formed by the respective pairs of ground shielding strips (and the respective inductor and ground shielding strip pair) shown in FIG. 5B.

Each pair of capacitors (550A-1 and 550B-1, 550A-2 and 550B-2, 550A-3 and 550B-3) may be controlled by a switching circuit. As shown in FIG. 5C, switching circuit 555-1 is coupled between capacitors 550A-1 and 550B-1, switching circuit 555-2 is coupled between capacitors 550A-2 and 550B-2, and switching circuit 555-3 is coupled between capacitors 550A-3 and 550B-3. It should be noted that switching circuits 555-1, 555-2, and 555-3 may represent NMOS transistors 525-1, 525-2, and 525-3 (as shown in FIG. 5B), respectively.

When any of the switching circuits 555-1, 555-2, and 555-3 is closed, the corresponding pair of capacitors are coupled in parallel. For example, when switching circuit 555-3 is closed, capacitor 550A-3 and capacitor 550B-3 are coupled in parallel. As mentioned, connecting capacitors in parallel may increase the overall capacitance in a circuit. Accordingly, when any of the switching circuits 555-1, 555-2, and 555-3 is closed, the total capacitance of circuit 500C may be increased. In one embodiment, any or all of switching circuits 555-1, 555-2, and 555-3 may be closed at any one time to obtain the desired capacitance. In the example of FIG. 5C, maximum capacitance may be obtained by closing all of switching circuits 555-1, 555-2, and 555-3.

It should be noted that even though four metal layers MX, MX+1, MX+2, and MX+3 are shown in the embodiment of FIG. 5B, more or fewer metal layers may be formed in an integrated circuit, and more (or fewer) ground shielding strips may be formed on those metal layers. Accordingly, more or fewer capacitors may be connected in circuit 500C of FIG. 5C. As an example, an additional metal layer may be formed above metal layer MX+3 of FIG. 5B and an additional ground shielding strip may be formed in that metal layer.

Figure 6:
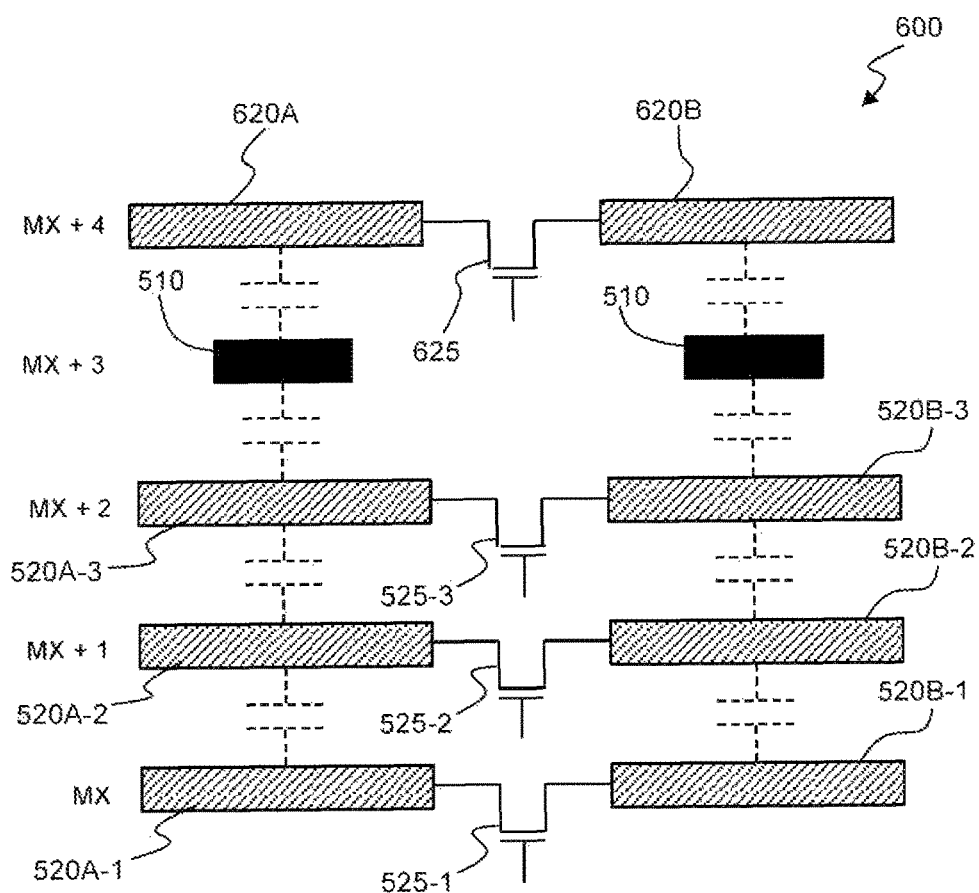
FIG. 6 shows a cross-sectional side view of an illustrative inductor structure formed between two metal layers in accordance with embodiments of the present invention.

FIG. 6 shows an illustrative cross-sectional side view 600 of an inductor structure formed between two metal layers in accordance with embodiments of the present invention. It should be noted that cross-sectional side view 600 shares similarities with cross-sectional side view 600B of FIG. 5B and as such, for the sake of brevity, elements that have been described above (e.g., inductor structure 510; metal layers MX, MX+1, MX+2, and MX+3; ground shielding strips 520A-1, 520A-2, 520A-3, 520B-1, 520B-2 and 520B-3; and switching circuits 525-1, 525-2, and 525-3) are not described in detail again.

In the embodiment of FIG. 6, an additional pair of ground shielding strips 620A and 620B are formed in metal layer MX+4 above inductor structure 510. Accordingly, the pair of ground shielding strips 620A/620B and inductor structure 510 may form a pair of capacitors (shown in dotted lines). A switching circuit 625 may be coupled between the pair of ground shielding strips 620A and 620B. Switching circuit 625 may connect the pair of ground shielding strips 620A and 620B together to adjust the capacitance value provided to inductor structure 510. In the embodiment of FIG. 6, an NMOS transistor is used as switching circuit 625. It should be noted that even though four switching circuits are shown in FIG. 6, more or fewer ground shielding strips may be formed in different metal layers and different numbers of switching circuits may be used in this context.

The embodiments, thus far, were described with respect to programmable logic circuits. The method and apparatus described herein may be incorporated into any suitable circuit. For example, the method and apparatus may also be incorporated into numerous types of devices such as microprocessors or other integrated circuits. Exemplary integrated circuits include programmable array logic (PAL), programmable logic arrays (PLAs), field programmable logic arrays (FPGAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), just to name a few.

The programmable logic device described herein may be part of a data processing system that includes one or more of the following components; a processor; memory; input-output circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by the assignee.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

The foregoing is merely illustrative of the principles of this invention and various modifications can be made by those skilled in the art without departing from the scope and spirit of the invention.

What is claimed is:

1. An integrated circuit die, comprising:
   a substrate layer;
   an inductor having an associated capacitance; and
      a plurality of ground shielding strips formed between the inductor and the substrate layer, wherein portions of the plurality of ground shielding strips are selectively activated to adjust the capacitance of the inductor, wherein a first group of ground shielding strips in the plurality of ground shielding strips runs orthogonally with respect to a first side of the inductor, wherein a second group of ground shielding strips in the plurality of ground shielding strips runs orthogonally with respect to a second side of the inductor that is different than the first side, and wherein a third group of ground shielding strips in the plurality of ground shielding strips runs orthogonally with respect to a third side of the inductor that is different from the first and second sides.

2. The integrated circuit die defined in claim 1, wherein the inductor is formed in a metal layer above the substrate layer, and wherein the integrated circuit die further comprises:
   at least an additional ground shielding strip formed in the metal layer to increase the capacitance of the inductor.

3. The integrated circuit die defined in claim 1, further comprising:
   a first switch coupled to the first group of ground shielding strips; and
   a second switch coupled to the second group of ground shielding strips.

4. The integrated circuit die defined in claim 1, wherein the inductor is formed in a metal layer above the substrate layer, wherein the first group of ground shielding strips is formed in a first metal layer below the metal layer, and wherein the second group of ground shielding strips is formed in a second metal layer below the first metal layer.

5. The integrated circuit defined in claim 1, further comprising:
   an additional plurality of ground shielding strips formed in a metal layer above the inductor, wherein portions of the plurality of ground shielding strips and the additional plurality of ground shielding strips are selectively activated to adjust the capacitance of the inductor.

6. The integrated circuit defined in claim 1, further comprising:
   at least one fuse element coupled to the plurality of ground shielding strips, wherein the at least one fuse element is adapted to selectively activate at least a portion of the plurality of ground shielding strips.

7. An integrated circuit die, comprising:
   a substrate layer;
   a plurality of metal routing layers formed above the substrate layer;
   an inductor having an associated capacitance formed in a first metal routing layer in the plurality of metal routing layers;
   a patterned ground shielding strip formed in the first metal routing layer and laterally adjacent to the inductor, wherein the patterned ground shielding strip increases the capacitance of the inductor;
   a first group of ground shielding strips that is formed in a second metal routing layer in the plurality of metal routing layers and that runs orthogonal to a first side of the inductor;
   a first switch for selectively grounding the first group of ground shielding strips;
   a second group of ground shielding strips that is formed in the second metal routing layer in the plurality of metal routing layers and that runs orthogonal to a second side of the inductor that is different than the first side;
   a second switch for selectively grounding the second group of ground shielding strips;
   a third group of ground shielding strips that is formed in the second metal routing layer in the plurality of metal routing layers and that runs orthogonal to a third side of the inductor that is different than the first and second sides; and
   a third switch for selectively grounding the third group of ground shielding strips.

8. The integrated circuit die defined in claim 7, further comprising:
   a plurality of vias that electrically connect the patterned ground shielding strip to the first group of ground shielding strips.

9. The integrated circuit defined in claim 7, wherein a fourth group of the ground shielding strips is formed in a third metal routing layer in the plurality of metal routing layers that is below the second metal routing layer.

10. The integrated circuit die defined in claim 7, further comprising:
   additional patterned ground shielding strips formed in at least one other metal routing layer of the plurality of metal routing layers, wherein the additional patterned ground shielding strips are formed above the inductor and the patterned ground shielding strip.

11. The integrated circuit die defined in claim 7, wherein no switch is coupled between the first and second groups of ground shielding strips.

* * * * *